(12) United States Patent
Kusakabe et al.

(10) Patent No.: US 6,995,320 B2
(45) Date of Patent: Feb. 7, 2006

(54) WIRING BOARD AND A PACKAGING ASSEMBLY USING THE SAME

(75) Inventors: Takeshi Kusakabe, Yokkaichi (JP); Isao Ozawa, Chigasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 68 days.

(21) Appl. No.: 10/676,732

(22) Filed: Sep. 30, 2003

(65) Prior Publication Data

US 2004/0104465 A1 Jun. 3, 2004

(30) Foreign Application Priority Data

Oct. 1, 2002 (JP) ............................ P2002-289220

(51) Int. Cl.
*H05K 1/00* (2006.01)
(52) U.S. Cl. .................... 174/260; 174/261; 361/760
(58) Field of Classification Search ............... 174/260, 174/262, 261, 254, 255; 361/760, 792, 793, 361/794, 795; 257/778, 691
See application file for complete search history.

(56) References Cited

U.S. PATENT DOCUMENTS

| | | | |
|---|---|---|---|
| 6,198,165 B1 * | 3/2001 | Yamaji et al. | 257/734 |
| 6,429,372 B1 | 8/2002 | Taguchi et al. | |
| 6,507,100 B1 * | 1/2003 | Valluri et al. | 257/697 |
| 2002/0096357 A1 * | 7/2002 | Iwasaki et al. | 174/250 |
| 2003/0071364 A1 | 4/2003 | Kusakabe et al. | |

* cited by examiner

*Primary Examiner*—Kamand Cuneo
*Assistant Examiner*—Ishwar Patel
(74) *Attorney, Agent, or Firm*—Hogan & Hartson, LLP (57) ABSTRACT

A wiring board includes an insulating board defined by a first surface and a second surface opposing to the first surface; first signal strips disposed on the first surface; a first power distribution plane provided on the first surface so as to occupy a residual area of the first signal strips; lands disposed on the second surface; via metals penetrating the insulating board so as to connect the lands to the corresponding first signal strips; a second power distribution plane provided on the second surface.

21 Claims, 13 Drawing Sheets

WIRING BOARD AND A PACKAGING ASSEMBLY USING THE SAME

CROSS REFERENCE TO RELATED APPLICATIONS

This application is based upon and claims the benefit of priority from the prior Japanese Patent Applications No. P2002-289220, filed on Oct. 1, 2002; the entire contents of which are incorporated herein by reference.

BACKGROUND OF THE INVENTION

1. Field of the Invention

The present invention relates to packaging assembly packaging technology, more specifically to a wiring board and a packaging assembly using the same for a BGA.

2. Description of the Related Art

According to the progress of high integration of semiconductor chips, demand for high-density mounting technique for packaging assemblies has increased. As a semiconductor package with increased density, dual in-line package (DIP), quad flat package (QFP), small out-line package (SOP), small out-line j-leaded package (SOJ), and the like are known. In the above semiconductor packages, reduction of a terminal pitch, surface mounting, and multi-terminal area are enabled. Recently, a multi-terminal ball grid array (BGA) package which can be surface-mounted at high density has been actively developed. In a wiring board of the semiconductor package, when frequency is increased due to the enhancement of an operating speed, power supply noise, cross talk noise or the like is generated. Especially, in a LSI chip which operates at the frequency of several hundred MHz and performs computation, development and practical use of the device which can suppress the occurrence of crosstalk noise occurring between signal wiring as much as possible is expected. As a method of shielding such noises, arranging a high voltage power distribution layer (VDD layer) or a low voltage power distribution layer (GND layer) between signal wirings is proposed.

Figure 1:
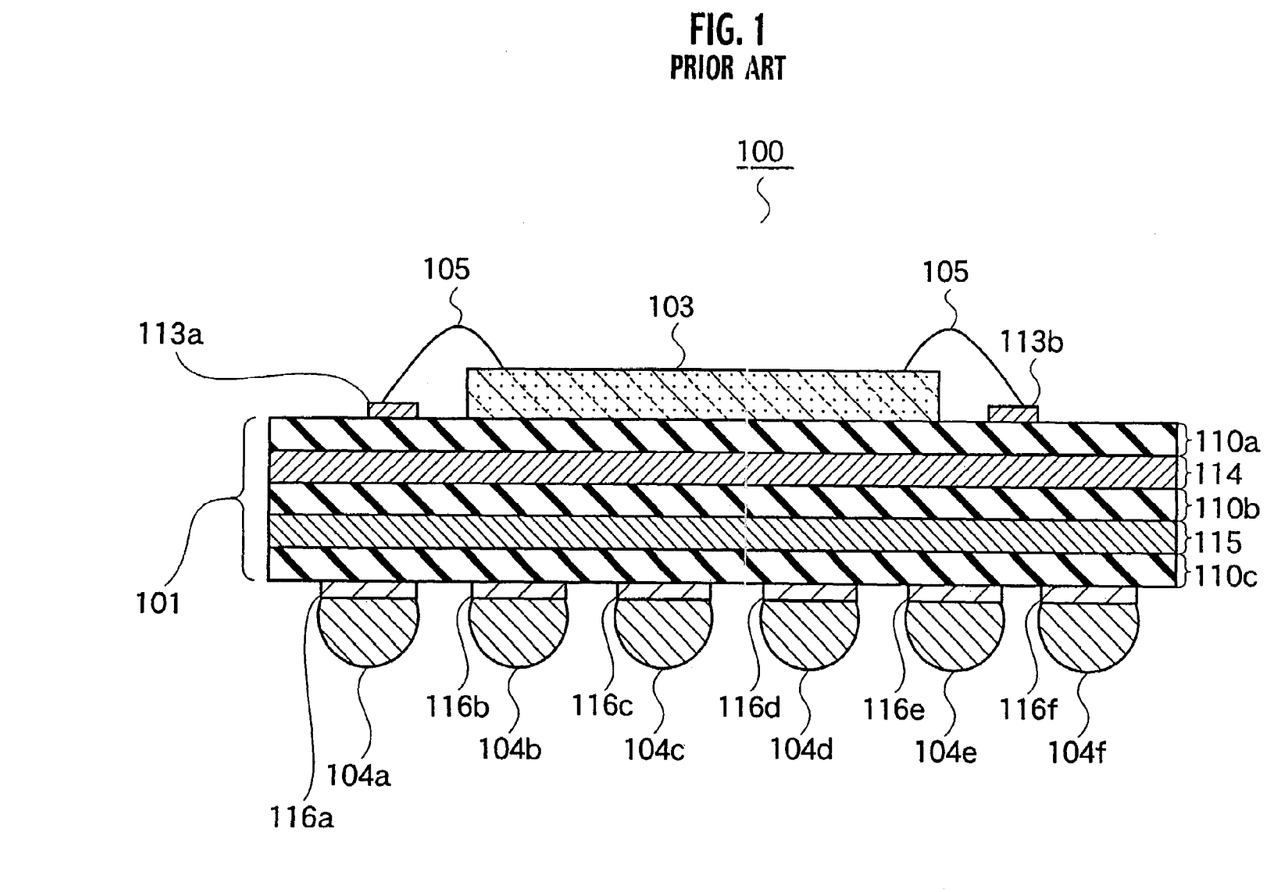
FIGS. 1 and 2 are sectional views showing an example of a general packaging assembly according to the related art of the present invention.

A packaging assembly 100 shown in FIG. 1 is an example of the semiconductor package used for a high speed static random access memory (SRAM) The packaging assembly 100 includes a multilayered substrate 101, a semiconductor chip 103 mounted on the multilayered substrate 101, and solder balls 104a, 104b, ..., and 104f arranged underneath the multilayered substrate 101. The multilayered substrate 101 further includes metal traces 113a and 113b, insulating boards 110a, 110b and 110c, a VDD layer 114, a GND layer 115, and lands 116a, 116b, ..., and 116f. The metal traces 113a and 113b are arranged on the top surface of insulating board 110a. The VDD layer 114 is stretched over the entire surface between the insulating board 110a and the insulating board 110b. The GND layer 115 is stretched over the entire surface between the insulating board 110b and the insulating board 110c. The lands 116a, 116b, ..., and 116f are arranged under the insulating board 110c. On the inside the multilayered substrate 101, through holes and via holes (not shown) are arranged, and metal traces 113a and 113b on the side of the chip are electrically connected in three-dimensional directions. In this way, as for the packaging assembly 100, the metal traces 113a and 113b and the lands 116a, 116b, ..., and 116f are arranged through the VDD layer 114 and the GND layer 115, which are metallic layers disposed over the entire surface between the insulating boards 110a, 110b, and 110c. Thus, the generation of noises can be shielded in three-dimensional directions.

Figure 2:
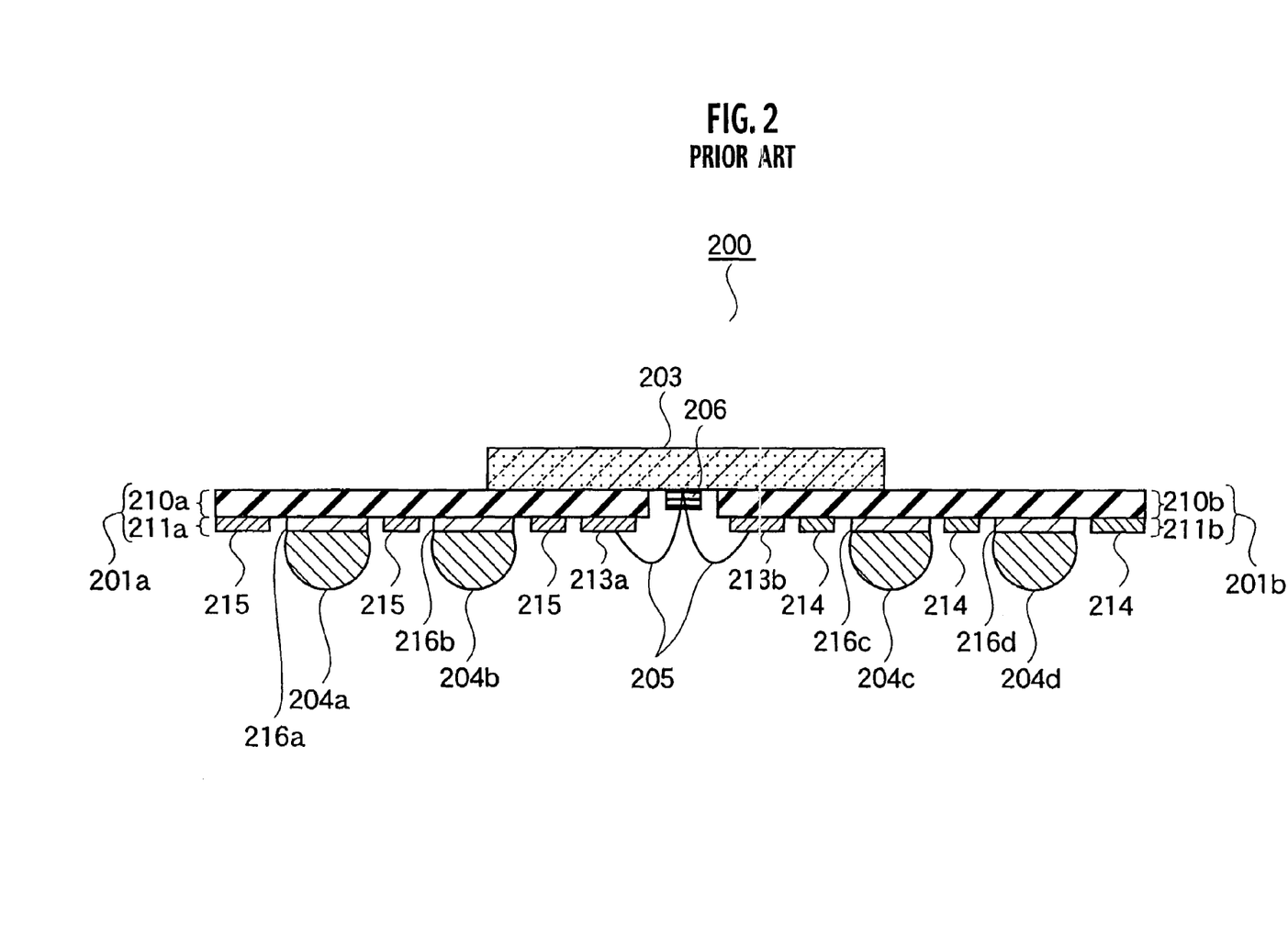

A packaging assembly 200 shown in FIG. 2 is an example of the semiconductor package used for rambus dynamic random access memory (RDRAM). The packaging assembly 200 includes a left-side wiring board 201a, a right-side wiring board 201b arranged on the same plane with the left-side wiring board 201a in such a manner that a space is formed therebetween. The packaging assembly 200 further includes a semiconductor chip 203 which is mounted face-down to the upper part of the left-side wiring board 201a and the right-side wiring board 201b. Bonding pads 206 are arranged underneath the semiconductor chip between the left-side wiring board 201a and the right-side wiring board 201b. Solder balls 204a, 204b, ..., and 204d are disposed underneath the wiring boards 201a and 201b. The left-side wiring board 201a includes an insulating board 210a and a wiring layer 211a disposed underneath the insulating board 210a. The wiring layer 211a includes lands 216a and 216b, a VDD wiring 215, and a signal wiring 213a. The lands 216a and 216b are disposed like a matrix underneath the insulating board 210a, the VDD wiring 215 is arranged surrounding the circumference of the lands 216a and 216b in parallel directions, and the signal wiring 213a is separately arranged from the lands 216a and 216b through the VDD wiring 215. The right-side wiring board 201b includes an insulating board 210b and a wiring layer 211b arranged underneath the insulating board 210b. The wiring layer 211b includes lands 216c and 216d, a GND wiring 214, and a signal wiring 213b. The land 216c is disposed underneath the insulating board 210b, the GND wiring 214 is arranged separately from the lands 216c and 216d surrounding the circumference of the lands 216c and 216d in parallel directions, and the signal wiring 213b is separately arranged from the lands 216c and 216d through the GND wiring 214. The signal wirings 213a and 213b are connected to the semiconductor chip 203 through bonding wires 205 and bonding pads 206. In the packaging assembly 200 forming the above-described structure, the signal wirings 213a and 213b and the GND wiring 214 or the VDD wiring 215 are arranged around the circumference of the lands 216c and 216d. Thus, the generation of noises can be shielded in two-dimensional directions.

However, in the packaging assembly 100 shown in FIG. 1, the leakage of the electromagnetic field, which is the cause of noise generation, can be shielded in three-dimensional directions. In addition, a plurality of dielectric layers and a plurality of metallic interconnection layers are required to for the multilayered substrate, in which the dielectric layers and the metallic interconnection layers are alternately laminated. Therefore, the entire body of the device becomes thick, involving a cost increase. Also, since the packaging assembly 200 shown in FIG. 2 has electric lines of force with large leakage, the effect of shielding the electromagnetic field is reduced compared with the multilayered substrate 101 shown in FIG. 1.

SUMMARY OF THE INVENTION

An aspect of the present invention inheres in a wiring board encompassing an insulating board defined by a first surface and a second surface opposing to the first surface; a plurality of first signal strips disposed selectively on the first surface; a first power distribution plane provided on the first surface so as to occupy a residual area of the first signal strips, disposing spaces along both sides of the first signal strips such that the first signal strips are electrically isolated from the first power distribution planes; a plurality of lands disposed on the second surface; a plurality of via metals penetrating the insulating board so as to electrically connect the lands to the corresponding first signal strips respectively; and a second power distribution plane provided on the second surface so as to occupy a residual area of the lands, disposing spaces along the lands such that the lands are electrically isolated from the second distribution plane.

Another aspect of the present invention inheres in a packaging assembly encompassing an insulating board defined by a first surface and a second surface opposing to the first surface; a plurality of first signal strips disposed selectively on the first surface; a first power distribution plane provided on the first surface so as to occupy a residual area of the first signal strips, disposing spaces along both sides of the first signal strips such that the first signal strips are electrically isolated from the first power distribution planes; a plurality of lands disposed on the second surface; a plurality of via metals penetrating the insulating board so as to electrically connect the lands to the corresponding first signal strips respectively; a second power distribution plane provided on the second surface so as to occupy a residual area of the lands, disposing spaces along the lands such that the lands are electrically isolated from the second distribution plane; and a semiconductor chip disposed on the first surface connected to a plurality of the pad potion formed at the end of the first signal strips and the first power distribution plane.

BRIEF DESCRIPTION OF DRAWINGS

FIGS. 14A to 14E are sectional views taken on line VIII—VIII in FIG. 9 and FIGS. 14F and 14G are sectional views taken on line X—X in FIG. 9.

DETAILED DESCRIPTION OF THE INVENTION

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified. Generally, and as it is conventional in the representation of semiconductor packaging assemblies, it will be appreciated that the various drawings are not drawn to scale from one figure to another nor inside a given figure, and in particular that the layer thicknesses are arbitrarily drawn for facilitating the reading of the drawings. In the following descriptions, numerous details are set forth such as specific signal values, etc. to provide a thorough understanding of the present invention. However, it will be obvious to those skilled in the art that the present invention may be practiced without such specific details.

(First Embodiment)

As shown in FIGS. 3 to 7, a wiring board 2 according to a first embodiment of the present invention includes an insulating board 10; a plurality of first signal strips 13$a$, 13$b$, ..., and 13$j$ arranged on a first surface of the insulating board 10; a plurality of first power distribution planes (high voltage power distribution planes) 14$a$ and 14$b$ which are arranged separately from the first signal strips 13$a$, 13$b$, ..., and 13$j$, configured to occupy the residual area of the first signal strips 13$a$, 13$b$, ..., and 13$j$ in the first surface of the insulating board 10; a plurality of lands 16$a$, 16$b$, ..., and 16$m$ disposed on the second surface of the insulating board 10; and a second power distribution plane (low voltage power distribution planes) 15 which are arranged separately from the lands 16$a$, 16$b$, ..., and 16$m$ configured to occupy the residual area of the lands 16$a$, 16$b$, ..., and 16$m$ in the second surface of the insulating board 10. Incidentally, direct current signals, that is, other power distribution lines or the like can be contained in the first signal strips 13$a$, 13$b$, ..., and 13$j$.

Figure 3:
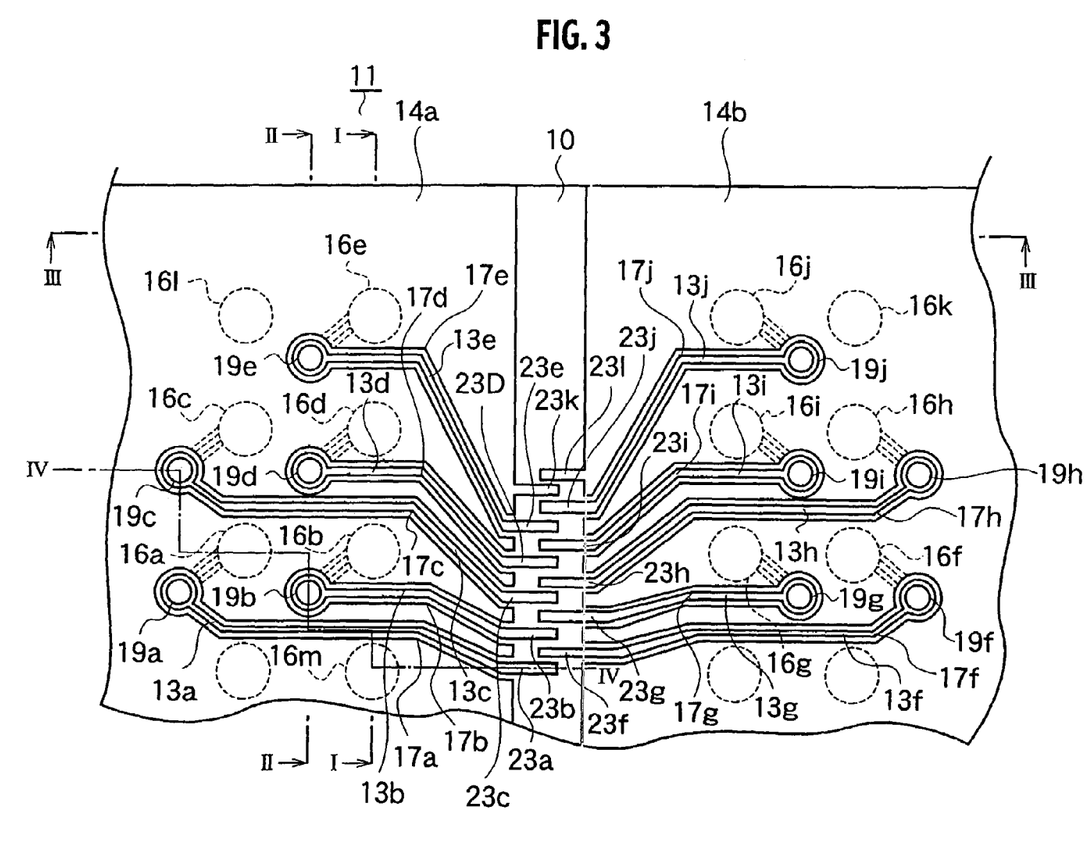
FIG. 3 is a plan view showing a first surface of a wiring base according to the first embodiment of the present invention.

As shown in FIG. 3, on the first surface, first signal strips 13$a$, 13$b$, ..., and 13$j$ are routed on the insulating board as a first level wiring layer 11. The first signal strips 13$a$, 13$b$, ..., and 13$j$ have bends 17$a$, 17$b$, ..., and 17$j$. The first signal strips 13$a$, 13$b$, ..., and 13$j$ have widths of 20 $\mu$m to 100 $\mu$m. The high voltage power distribution planes (first power distribution planes) 14$a$ and 14$b$ are arranged 30 $\mu$m to 120 $\mu$m apart. A plurality of grooves are formed in the high voltage power distribution planes, so that spacings each having a constant width can be disposed longitudinally along both sides of the respective first signal strips 13$a$, 13$b$, ..., and 13$j$. The high voltage power distribution planes (first power distribution planes) 14$a$ and 14$b$, which have a plate-shaped topology arranged across almost the entire surface of the insulating board 10 (see FIG. 7), deliver the high power supply voltage (VDD) and in addition thereto function as shielding planes against the electromagnetic field from the lands 16$a$, 16$b$, ..., and 16$m$ of the second surface. End parts of the first signal strips 13$a$, 13$b$, ..., and 13$j$ are respectively connected to via metals disposed on corresponding inner walls of the through holes 19$a$, 19$b$, ..., and 19$j$ formed in the insulating board 10 as shown in FIG. 3. In addition, at an end of the first signal strip 13$a$ opposing to the other end connected to the through hole 19$a$, a wiring pad portion 23$a$ is protruded from the high voltage power distribution planes (first power distribution planes). Similarly, at the ends of the signal wirings 13b, 13c, . . . , and 13j, opposing to the other ends connect to the through holes 19b, 19c, . . . , and 19j, wiring pad portions 23b, 23c, . . . , 23j are protruded from the high voltage power distribution planes 14a and 14b. In the vicinity of the wiring pad portions 23a, 23b, . . . , and 23j, power pad portions 23k and 23l are protruded in the same direction with the wiring pad portions 23a, 23b, . . . , and 23j On the upper part of the power pad portions 23k and 23l, and the wiring pad portions 23a, 23b, . . . , and 23j, the semiconductor chip 3 is mounted via solder bumps and so on.

Figure 4:
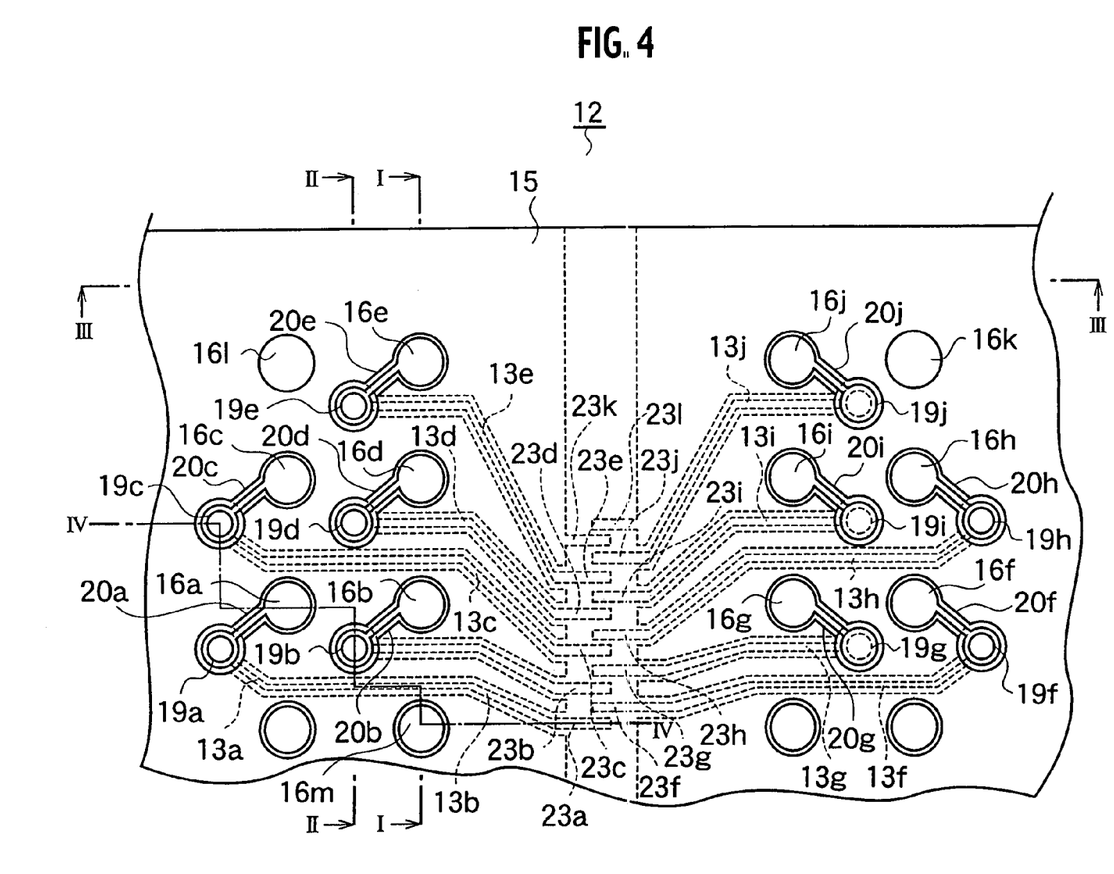
FIG. 4 is a plan view showing a second surface of the wiring base according to the first embodiment of the present invention.
Figure 7:
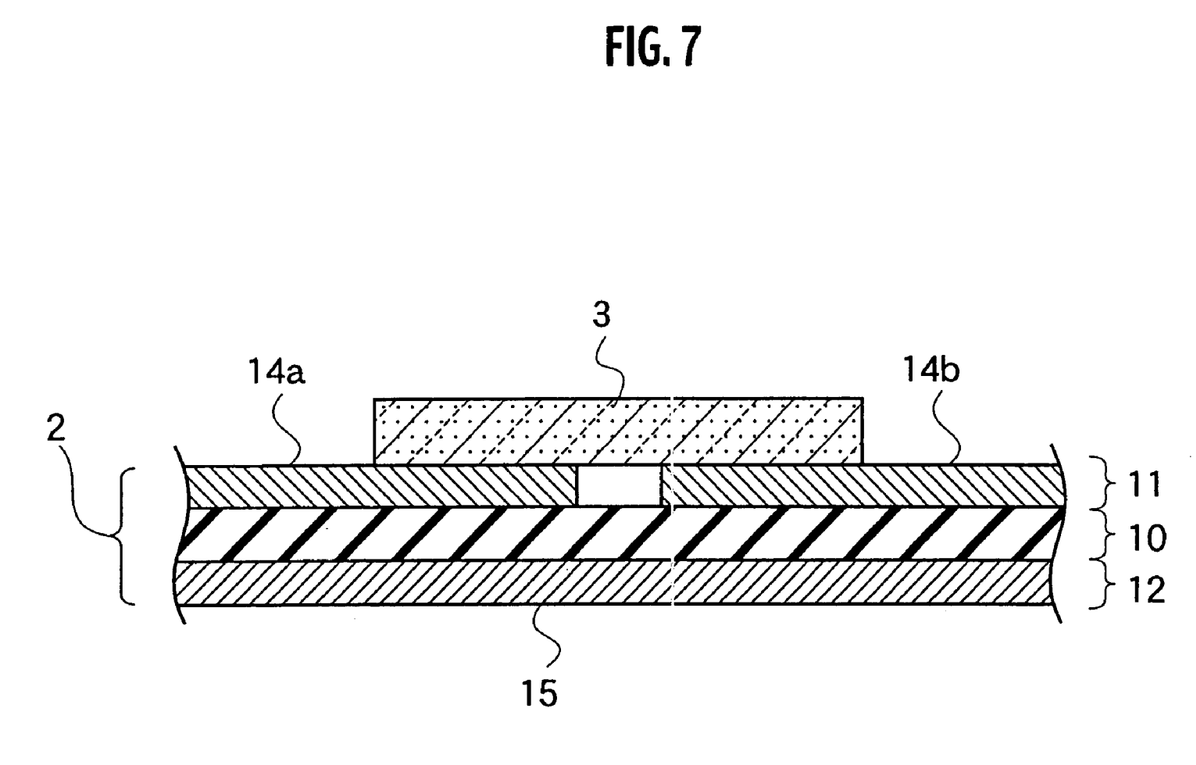
FIG. 7 is a sectional view taken on line III—III in FIG. 3.

As shown in FIG. 4, on the second surface, the lands 16a, 16b, . . . , and 16m are arranged in a matrix corresponding to the topology of arrangements of the through holes 19a, 19b, . . . , and 19j, as a second level wiring layer 12. The lands 16a, 16b, . . . , and 16m and the corresponding through holes 19a, 19b, . . . , and 19j are connected by means of the second signal strips 20a, 20b, . . . , and 20j provided on the second surface. The second signal strips 20a, 20b, . . . , and 20j have widths of 20 μm to 100 μm. Note that, the lands 16a, 16b, . . . , and 16m are arranged away from the positions facing the first signal strips 13a, 13b, . . . , and 13j of the first surface side, the route of which are shown by dotted lines in FIG. 4, through the insulating board 10. On the circumference of the lands 16a, 16b, . . . , and 16m, through holes 19a, 19b, . . . , and 19j, and the second signal strips 20a, 20b, . . . , and 20j, as shown in FIG. 7, the low voltage power distribution planes (second power distribution planes) serving as a ground (GND) are arranged on the entire surface. The low voltage power distribution plane 15 works as a shielding plane against the electromagnetic field of high frequency from the first signal strips 13a, 13b, . . . , and 13j on the first surface. Incidentally, as shown in FIG. 5, the lands 16a, 16b, . . . , and 16m are metal patterns so that the solder balls 4a, 4b, 4c and 4d may be mounted thereon.

Figure 5:
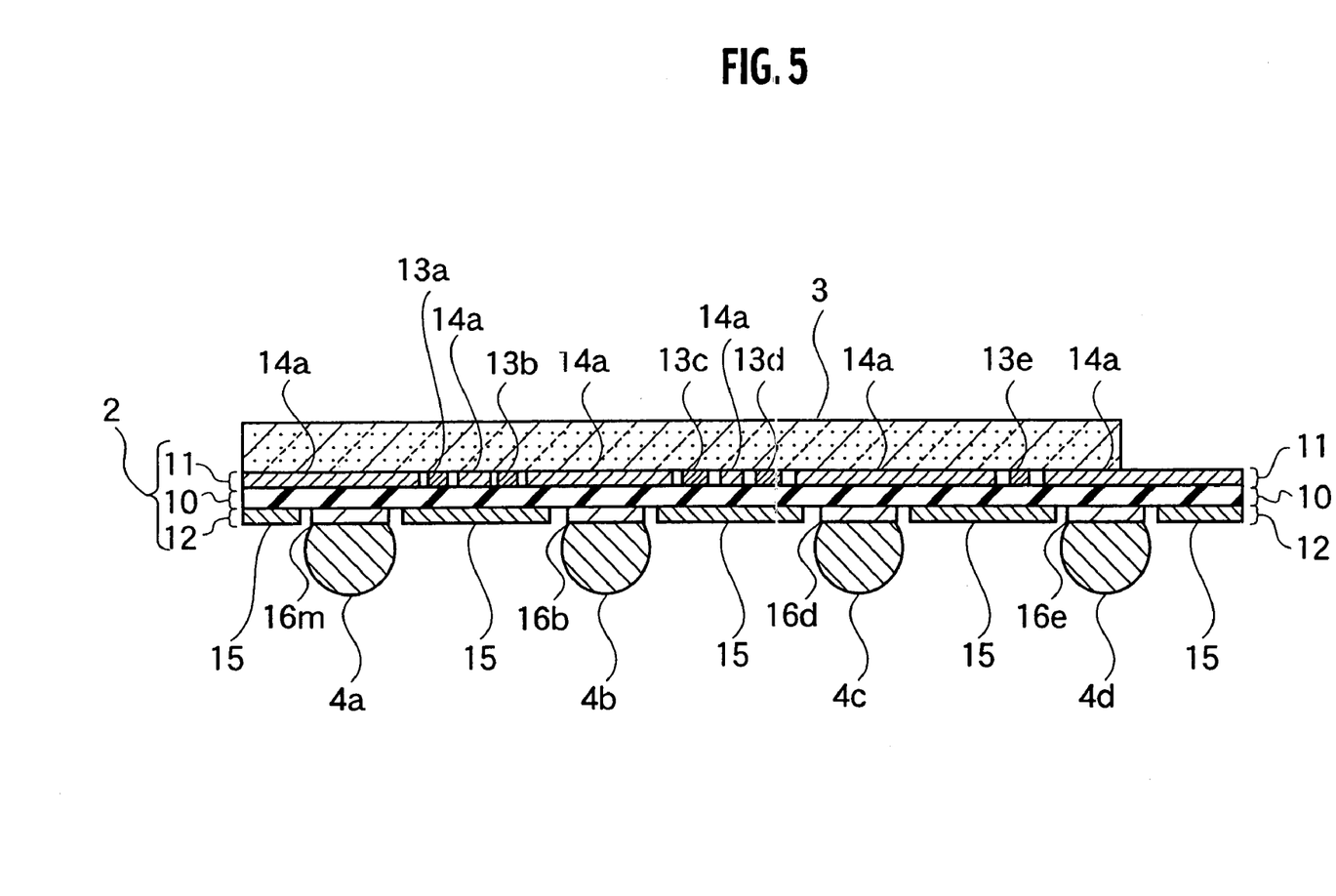
FIG. 5 is a sectional view taken on line I—I line in FIG. 3.
Figure 6:
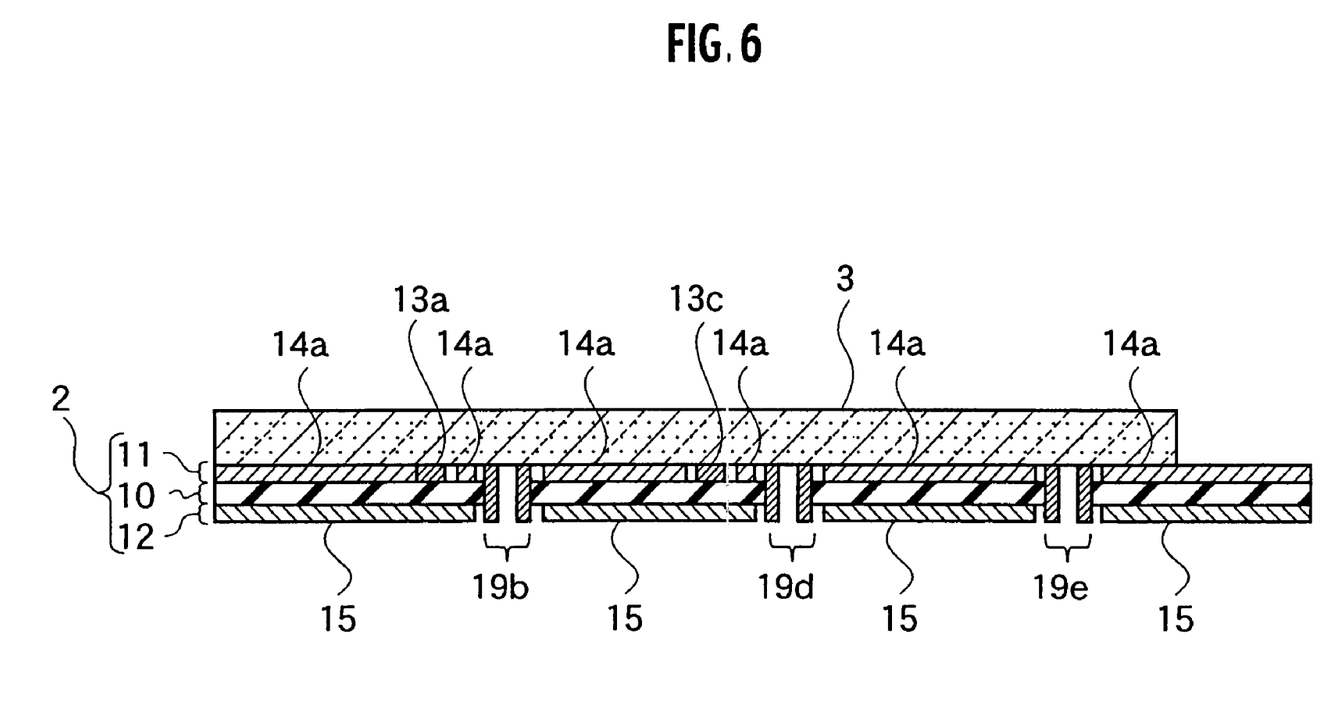
FIG. 6 is a sectional view taken on line II—II in FIG. 3.

FIG. 5 is a sectional view of the packaging assembly according to the first embodiment taken on line I—I of FIG. 3. The semiconductor chip 3 is mounted face down so as to be flip-chip-connected to the first surface having the first level wiring layer 11 disposed thereon. Underneath the lands 16m, 16b, 16d, and 16e, solder balls 4a, 4b, 4c, and 4d are respectively arranged in a matrix. Incidentally, the positions of the lands 16m, 16b, 16d, and 16e are not limited. For example, the lands 16m, 16b, 16d, and 16e may be disposed on the outer periphery of the wiring board 2.

In the wiring board 2 according to the first embodiment of the present invention, the high voltage power distribution planes 14a and 14b and the low voltage power distribution plane 15 arranged in adjacent to the first signal strips 13a, 13b, . . . , and 13j and the lands 16a, 16b, . . . , and 16m of the second surface, function as a shielding plane against a strong electromagnetic field generated when a high-frequency current is applied on the first signal strips 13a, 13b, . . . , and 13j of the first surface and the lands 16a, 16b, . . . , and 16m of the second surface. Therefore, according to the wiring board 2 shown in FIGS. 3 to 7, the generated noises can be three-dimensionally shielded. Thus, more effective shielding against the electromagnetic field is enabled compared with the case where the signal wirings 213a and 213b and the lands 16a, 16b, 16c, and 16d, as shown in FIG. 2, are arranged on the same plane (two-dimensionally) with the wiring boards 201a and 201b. Further, with the wiring board 2 shown in FIGS. 3 to 7, on the surface of the insulating board 10 having the first signal strips 13a, 13b, . . . , and 13j and the lands 16a, 16b, . . . , and 16m arranged thereon, the high voltage power distribution planes 14a and 14b and the low voltage power distribution plane 15 is arranged. Therefore, the packaging assembly, which is reduced in thickness and cost through simplified manufacturing can be achieved compared with the case where the VDD layer 114 and the GND layer 115 are arranged between the insulating boards 110a, 110b, and 110c as shown in FIG. 1. It is sufficient if the first signal strips 13a, 13b, . . . , and 13j and the lands 16a, 16b, . . . , and 16m are shielded by a shield plate of a constant potential. Therefore, the pattern of the high voltage power distribution planes 14a and 14b or the low voltage power distribution plane 15 can be changed if required. Further, the closer the high voltage power distribution planes 14a and 14b or the low voltage power distribution plane 15 are set to the first signal strips 13a, 13b, . . . , and 13j or the lands 16a, 16b, . . . , and 16m, the higher the shielding effect of the wiring board 2. Accordingly, the high voltage power distribution planes 14a and 14b or the low voltage power distribution plane 15 are preferably arranged about 30 μm to 120 μm apart from the first signal strips 13a, 13b, . . . , and 13j or the lands 16a, 16b, . . . , and 16m.

Next, with FIGS. 8A to 8F, a manufacturing method of the wiring board 2 according to the first embodiment of the present invention and a manufacturing method of the packaging assembly using the wiring board 2 will be explained. As a matter of course, manufacturing methods described below are examples, and various modifications are achievable by means of various manufacturing methods other than this method.

Figure 8A:
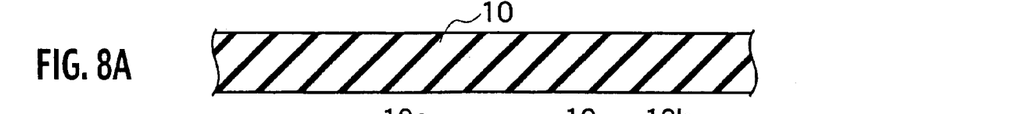
FIGS. 8A to 8F are sectional views showing a method of manufacturing the first level assembly taken on line IV—IV in FIG. 3 according to the first embodiment of the present invention.

(a) First, as shown in FIG. 8A, the insulating board 10 made of an epoxy resin having thickness of 30 μm to 60 μm is prepared. For the materials of insulating board 10, apart from the epoxy resin, a polyimide resin, a phenol resin, or a ceramic, a silicon carbide and the like can be used. Although not shown, copper foil is affixed to the first and second surfaces of the insulating board 10 thereafter the copper foil is made thinner by etching.

Figure 8B:
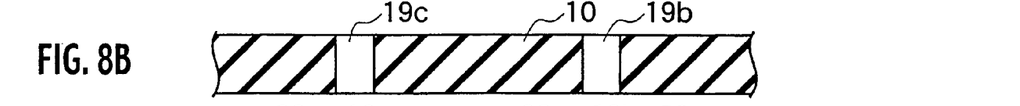

(b) Next, as shown in FIG. 8B, circular through holes 19b and 19c having a diameter of 100 to 200 μm are formed in the insulating board 10 by a laser method or the like. Incidentally, the through holes 19b and 19c may be formed by an ordinary mechanical drill method used heretofore. The through holes 19b and 19c may be oval, polygonal and the like.

Figure 8C:
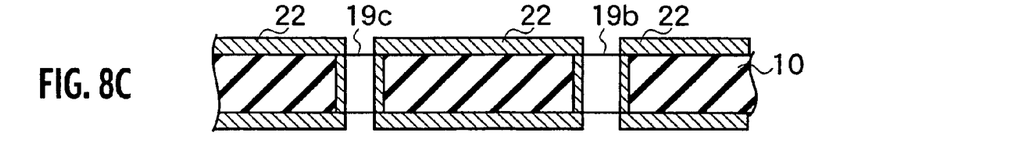

(c) Next, as shown in FIG. 8C, metal films 22, such as copper, nickel, and gold having thickness of 25 μm to 35 μm are formed by a vacuum evaporation method, an electroless plating method or the like. At this time, on the inner walls of through holes 19b and 19c, plating is applied similarly for connection between the first and second level wiring layers using metallic material such as copper.

Figure 8D:
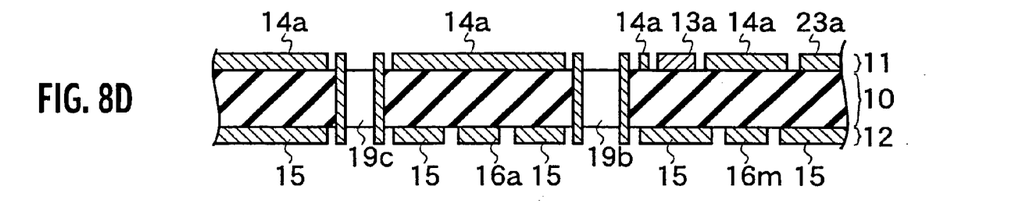

(d) Next, the metal films 22 are coated with a photoresist film and the photoresist film is delineated by a photolithography technique, the metal film 22 is then etched with the delineated photoresist film as an etching mask to define the first level wiring layer 11 as shown in FIG. 8D. The first level wiring layer 11 includes the signal wiring 13a, the high voltage power distribution plane 14a for supplying VDD, and the pad portion 23a for mounting the semiconductor chip 3 thereon. After removing the photoresist film on the first surface, a new photoresist film is coated on the metal film 22, and the new photoresist film is delineated so as to form an etching mask for defining the second surface to form the second level wiring layer 12 by etching. The second level wiring layer 12 includes the low voltage power distribution plane 15 serving as GND, the lands 16a and 16m for mounting the solder balls 4a and 4e thereon, and the second signal strips (not shown)

Figure 8E:
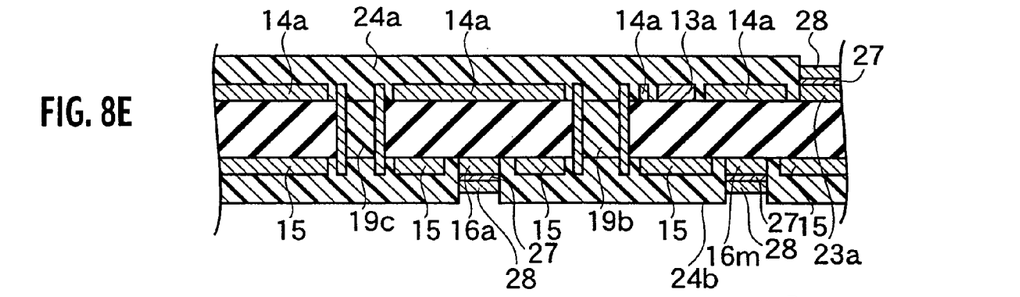

(e) Next, as shown in FIG. 8E, a first solder resist film 24a and a second solder resist film 24b are coated on the first level wiring layer 11 and the second level wiring layer 12 respectively. Then, the first solder resist layer 24a is delineated by the photolithography technique for exposing selectively a part of the surface of the first level wiring layer 11 so as to define the pad portion 23a. The second solder resist 24b is delineated by the photolithography technique for exposing selectively a part of the second level wiring layer 12 so as to define the lands 16a and 16m. Then, surfaces of the pad portion 23a of the first surface and the lands 16a and 16m of the second surface are plated by a nickel (Ni) film 27, and a gold (Au) film 28.

Figure 8F:
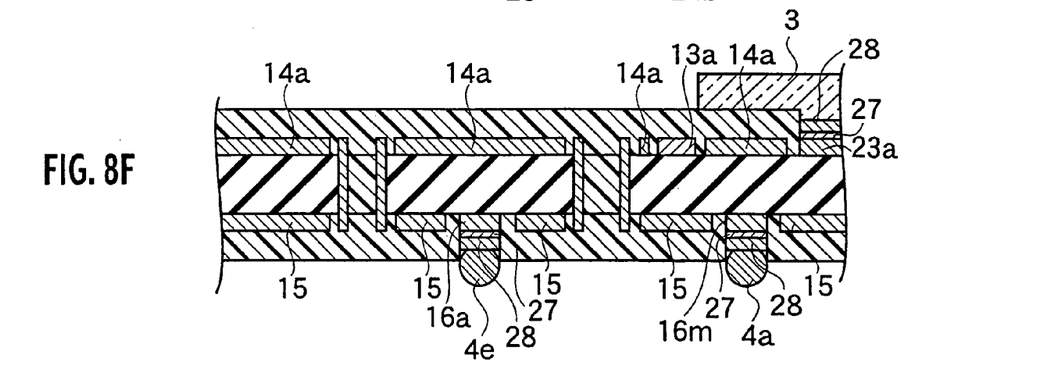

(f) Next, as shown in FIG. 8F, the semiconductor chip 3 is mounted on the pad portion 23a through a solder bump, which is not shown. Solder balls 4e and 4a are respectively mounted on the lands 16a and 16m.

Through the above processes, the wiring board 2 shown in FIGS. 3 to 7, and the packaging assembly using the wiring board 2 can be accomplished. According to a manufacturing method of the wiring board 2 of the first embodiment of the present invention and a packaging assembly using the wiring board 2, it is possible to manufacture a simple and a low-cost wiring board 2 and the packaging assembly capable of three-dimensionally shielding noises generated between signal wirings using the one-layer insulating board 10. Incidentally, either the first level wiring layer 11 or the second level wiring layer 12 can be patterned first.

(Second Embodiment)

Figure 13:
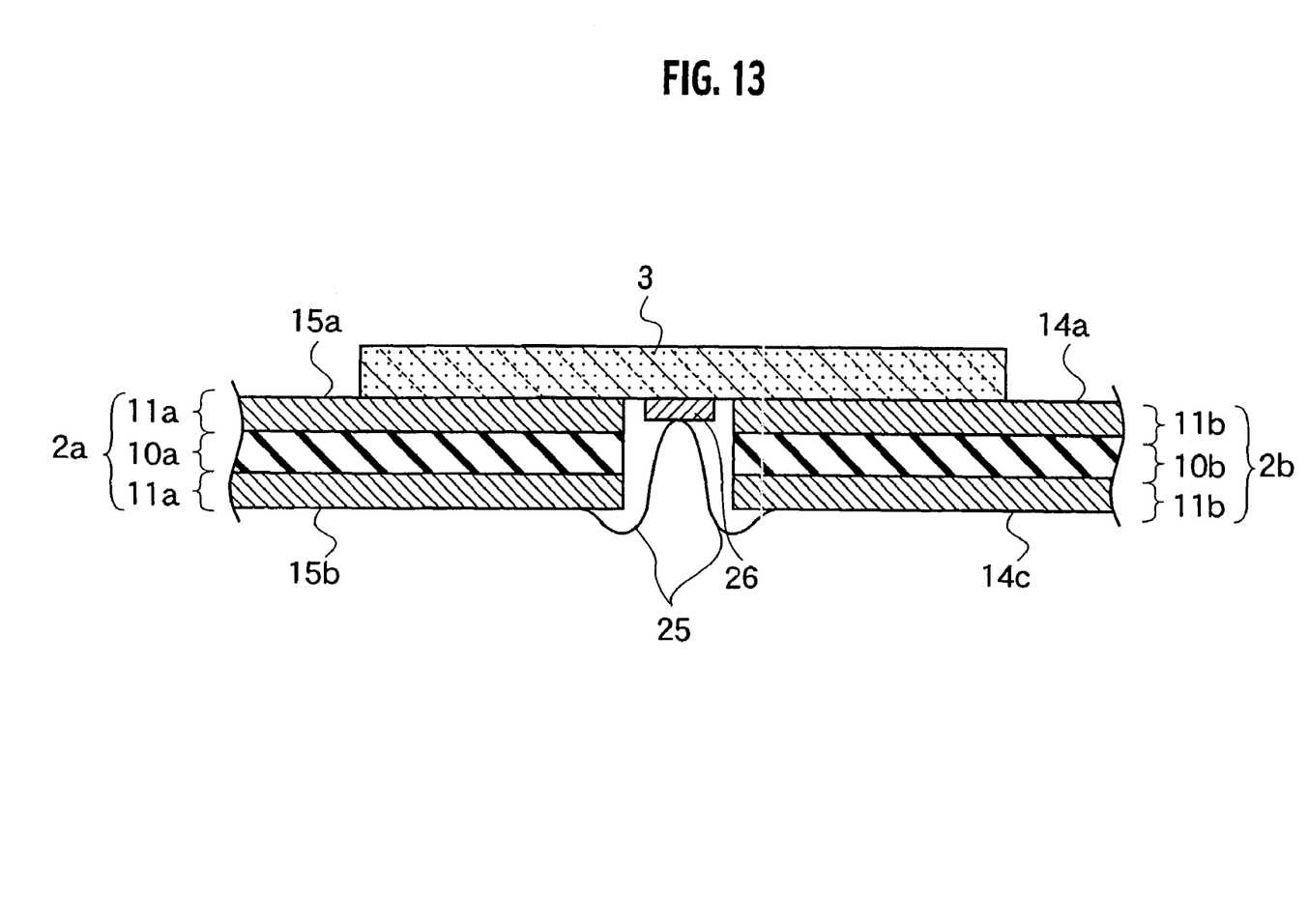
FIG. 13 is a sectional view taken on line VIII—VIII in FIG. 9.

The first level assembly according to the second embodiment of the present invention is different from the first embodiment in that, as shown in FIGS. 9 to 13, the second embodiment includes two sheets of wiring boards 2a and 2b, and the wiring boards 2a and 2b further include through holes 19n, 19o, . . . , and 19v respectively for connecting to bonding pads 26a, 26b, . . . , and 26k. Further, the second embodiment is different from the first embodiment in that, as shown in FIG. 13, the semiconductor chip 3 of the second embodiment disposed on the first surface of the wiring boards 2a and 2b is electrically connected through bonding pads 26a, 26b, . . . , and 26k disposed on a wiring board opening 30 disposed between the wiring board 2a and the wiring board 2b. Other structures are the same as the packaging assembly shown in FIG. 3, detailed explanations are omitted.

Figure 9:
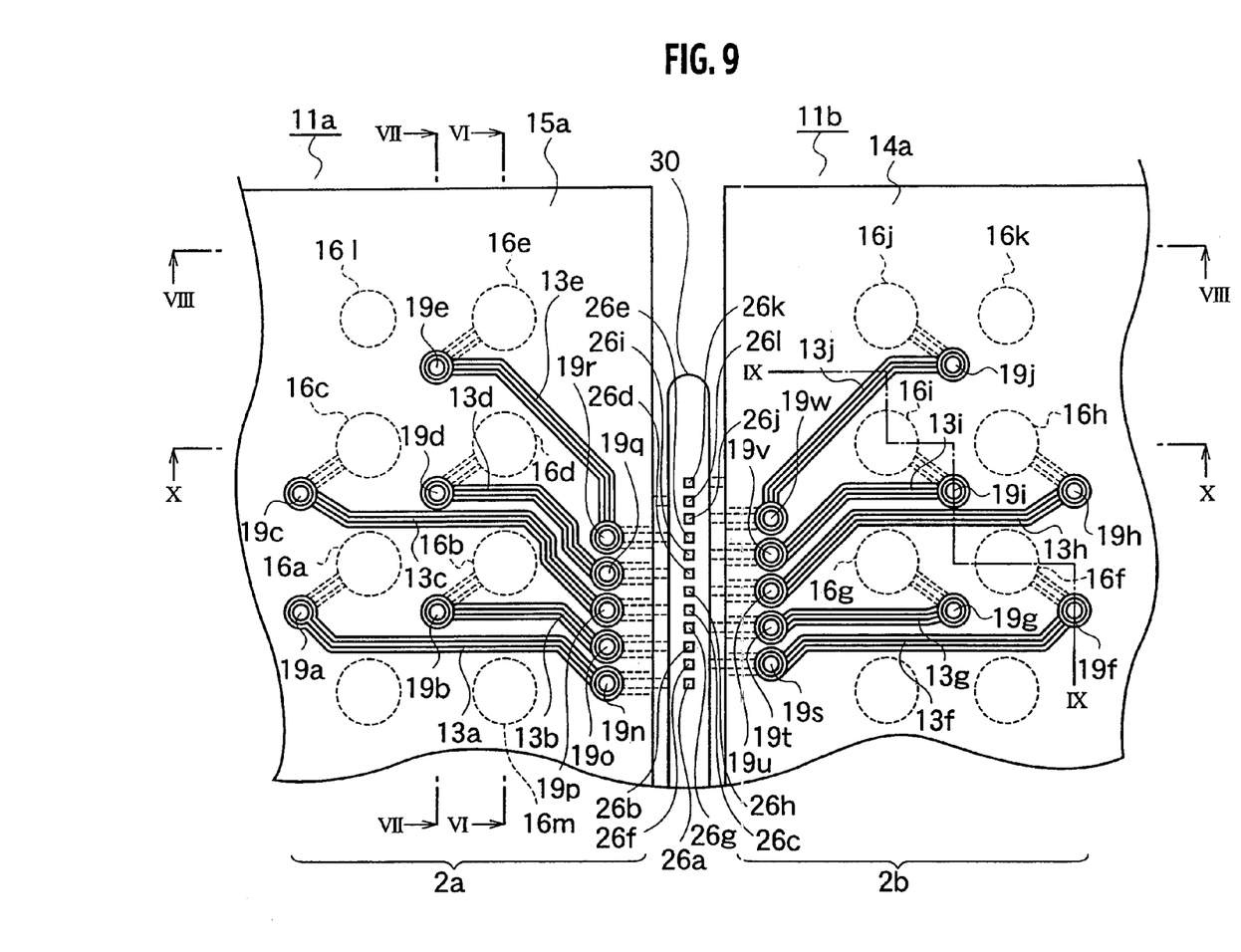
FIG. 9 is a plan view showing a first surface of the wiring base according to the second embodiment of the present invention.
Figure 10:
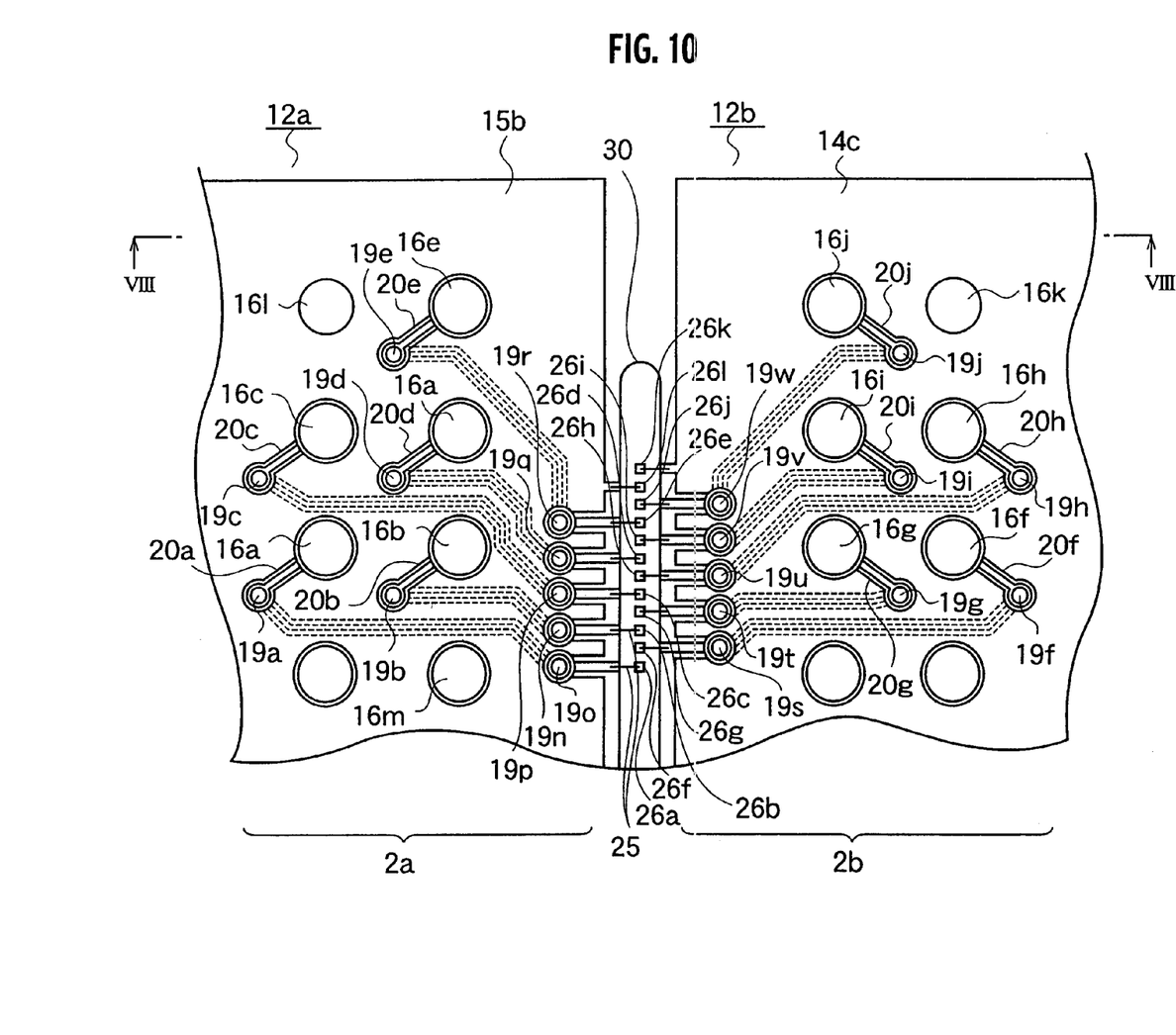
FIG. 10 is a plan view showing a second surface of the wiring base according to the second embodiment of the present invention.

As shown in FIG. 9, on the first surface, first signal strips 13a, 13b, . . . , and 13j are routed on the insulating board 10 as the first wiring layers 11a and 11b. The low voltage power distribution plane (first power distribution plane) 15a serving as GND is arranged on the first level wiring layer 11a. Meanwhile, the high voltage power distribution plane (first power distribution plane) 14a for supplying VDD is arranged on the first level wiring layer 11b. The low voltage power distribution plane and the high voltage power distribution plane are arranged so as to longitudinally form a groove having a constant depth on both sides of the first signal strips 13a, 13b, . . . , and 13j, having a space of 30 $\mu$m to 120 $\mu$m respectively on the insulating board 10, each occupying the residual area of the first surface. The low voltage power distribution plane 15a and high voltage power distribution plane 14a are arranged almost over the entire surface of the insulating board 10 (see FIG. 13). In addition, as shown in FIG. 9, ends of the first signal strips 13a, 13b, and 13j opposing to the other ends connected to the through holes 19a, 19b, . . . , and 19j are respectively connected to the metal layer at the inner wall of the through holes 19n, 19o, . . . , and 19v linearly arranged in the vicinity of the bonding pads 26a, 26b, . . . , and 26k. The through holes 19n, 19o, . . . , and 19v are, as shown in FIG. 10, electrically connected to the bonding pads 26a, 26b, . . . and 26k through a pad portion and a bonding wire 25, which are not shown. A plurality of bonding pads 26a, 26b, . . . , and 26k are respectively connected to a donor of about $1 \times 10^{18}$ cm$^{-3}$ to $1 \times 10^{21}$ cm$^{-3}$ formed on the element forming surface of the semiconductor chip 3, or a plurality of high impurity density regions (a source region/a drain region, or an emitter region/a collector region or the like) with doped acceptors and the like.

As shown in FIG. 10, on the second surface, the lands 16a, 16b, . . . , and 16m are arranged in a matrix corresponding to the through holes 19a, 19b, . . . , and 19j, as the second level wiring layers 12a and 12b. The lands 16a, 16b, . . . , and 16m are arranged away from the position facing the first signal strips 13a, 13b, . . . , and 13j on the first surface side shown by dotted lines, about the insulating board 10a and 10b. The low voltage power distribution plane 15b and the high voltage power distribution plane 14c serving as the second power distribution planes are arranged 30 $\mu$m to 120 $\mu$m away from the lands 16a, 16b, . . . , and 16m so as to form a groove having a constant depth surrounding the outer periphery of the lands 16a, 16b, . . . , and 16m. In addition, with the second level wiring layer 12a, the low voltage power distribution plane serving as GND (second power distribution plane) 15b is arranged, and in the second level wiring layer 12b, the high voltage power distribution plane (second power distribution plane) 14c for supplying VDD is arranged over the entire surface of the second surface (see FIG. 13).

Figure 11:
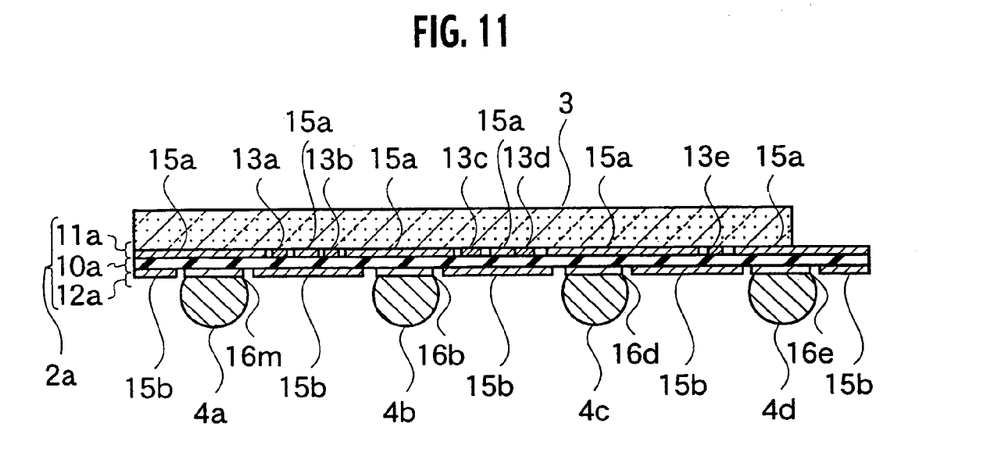
FIG. 11 is a sectional view taken on line VI—VI in FIG. 9.
Figure 12:
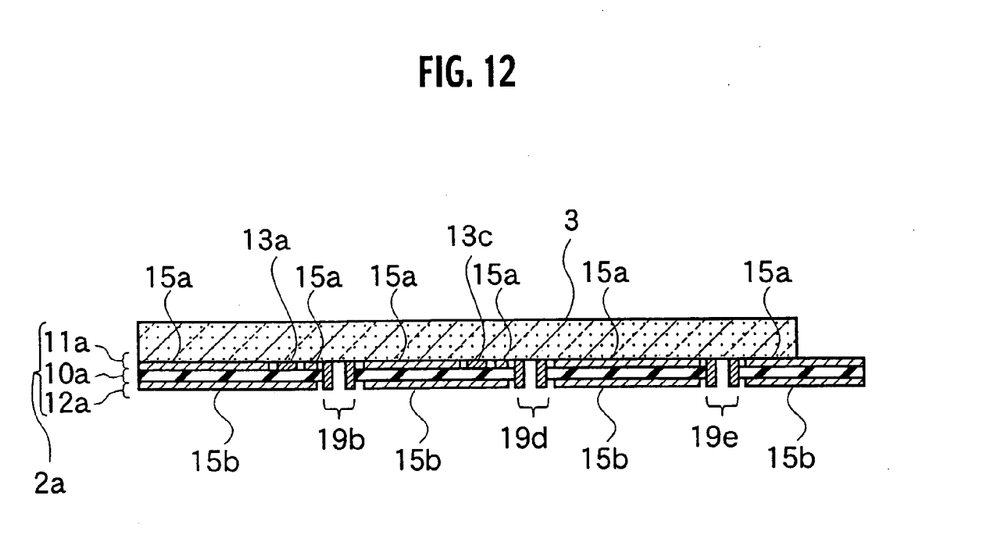
FIG. 12 is a sectional view taken on line VII—VII in FIG. 9.

FIG. 11 is a sectional view of the packaging assembly according to the second embodiment taken on line VI—VI of FIG. 9. On the first level wiring layer 11a, the semiconductor chip 3 is mounted, and on the lands 16m, 16b, 16d, and 16e, the solder balls 4a, 4b, 4c, and 4d are disposed. In addition, as shown in FIG. 13, the semiconductor chip 3 is connected to the low voltage power distribution plane (second power distribution plane) 15b and the high voltage power distribution plane (second power distribution plane) 14c through the bonding wire 25.

According to the packaging assembly of the second embodiment of the present invention, even in the case where a plurality of wiring boards 2a and 2b are connected by using the bonding wire 25, the high voltage power distribution planes 14a and 14c that supply VDD over the entire surface, or the low voltage power distribution planes 15a and 15b serving as GND are arranged in parallel directions, and vertical directions to the first signal strips 13a, 13b, . . . , and 13j and the lands 16a, 16b, . . . and 16m. Accordingly, the high voltage power distribution planes 14a and 14c and the low voltage power distribution planes 15a and 15b function as a shielding plane against a strong magnetic field which is generated when a high-frequency current is made to flow through the first signal strips 13a, 13b, . . . , and 13j. Therefore, the generated noises can be three-dimensionally shielded unlike in the packaging assemblies 100 and 200 as shown in FIGS. 1 and 2. In addition, the high voltage power distribution planes 14a and 14c and the low voltage power distribution planes 15a and 15b are disposed as a pattern surrounding the first signal strips 13a, 13b, . . . , and 13j and the lands 16a, 16b, . . . , and 16m, thereby miniaturizing the packaging assembly compared with the packaging assembly 100 shown in FIG. 1. In addition, the packaging assembly shown in FIG. 13 can be wire-bonded, thereby reducing the manufacturing cost compared with flip-chip mounting.

Next, using FIGS. 14A to 14G, a manufacturing method of the packaging assembly according to the second embodiment of the present invention will be explained. Incidentally, FIGS. 14A to 14D are manufactured by the same manufacturing method of the packaging assembly as that shown in FIG. 8, and thereby overlapping explanation and description are omitted.

Figure 14A:
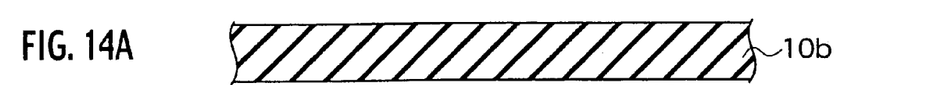
FIGS. 14A to 14G are sectional views showing a method of manufacturing the first level assembly according to the second embodiment of the present invention.
Figure 14B:
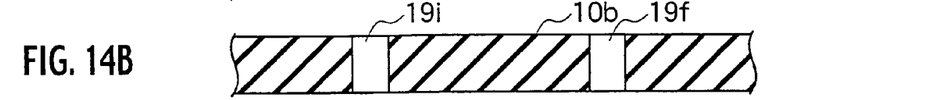
Figure 14C:
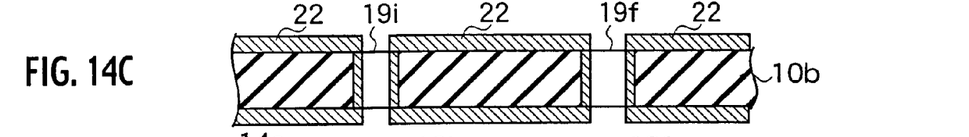
Figure 14D:
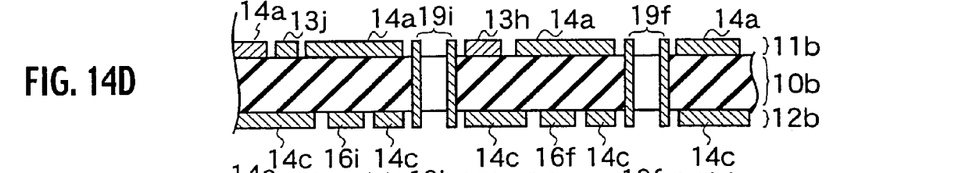
Figure 14E:
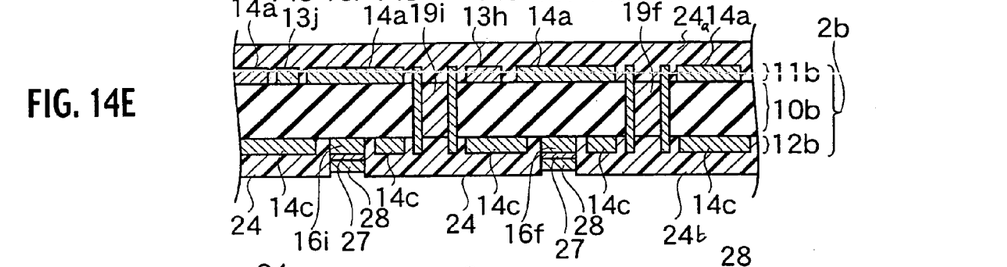

(e) Next, as shown in FIG. 14E, a first solder resist film 24a and a second solder resist film 24b are coated on the first level wiring layer 11b and the second level wiring layer 12b respectively. Then the first solder resist film 24a is delineated by the photolithography technique for exposing selectively a part or the surface of the first level wiring layer 11b so as to define the pad portion 23a. The second solder resist 24b is delineated by the photolithography technique for exposing selectively a part of the second level wiring layer 12b so as to be define the lands 16i and 16f. Further, the surfaces of the lands 16i and 16f are plated with a nickel (Ni) film 27 and a gold (Au) film 28.

Figure 14F:
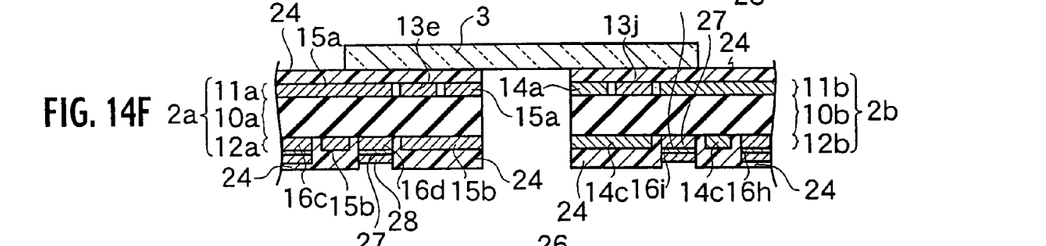
Figure 14G:
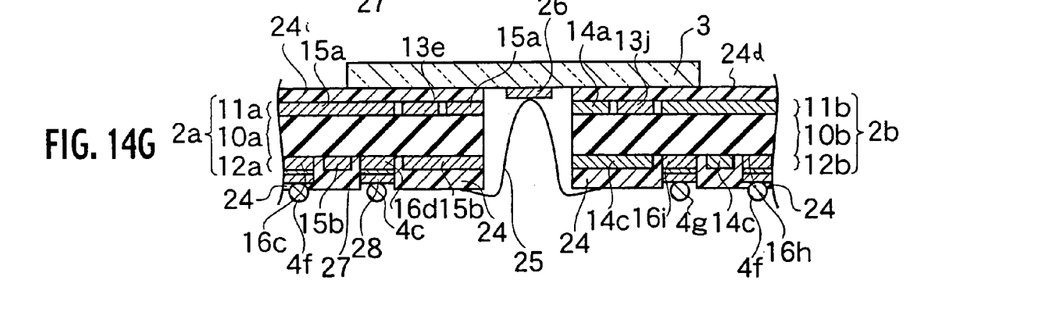

(f) As shown in FIG. 14F, on the wiring layers 11a and 11b, the semiconductor chip 3 is disposed. Then, as shown in FIG. 14G, the bonding pad 26 connected to the semiconductor chip 3 and the wiring boards 2a and 2b are connected by using the bonding wires 25.

By the above-described processes, the packaging assembly according to the second embodiment of the present invention can be accomplished. In the wiring board 2 according to the second embodiment of the present invention and the packaging assembly using the wiring board 2, the leakage of the magnetic field can be three-dimensionally shielded with a two-layer wiring layer, thereby enabling manufacture of the packaging assembly easily at low cost.

(Other Embodiments)

In the above-described first and second embodiments, the high voltage power distribution planes 14a, 14b, and 14c for supplying VDD, and the low voltage power distribution planes 15, 15a, and 15b serving as GND are allowed to be arranged at any position of the circumference of the first signal strips 13a, 13b, . . . , and 13j or the lands 16a, 16b, . . . , and 16m. Further, in the above-described first and second embodiments, even when the first signal strips 13a, 13b, . . . , and 13j and the lands 16a, 16b, . . . , and 16m are arranged so as to face each other sandwiching the insulating board 10, the effect of shielding the noise can be attained. Further, the wiring boards 2, 2a, and 2b according to the above-described first and second embodiments can be applied to the packaging assembly with high frequency and speed, in addition to a BGA semiconductor package.

What is claimed is:

1. A wiring board comprising:
an insulating board defined by a first surface and a second surface opposing to the first surface;
a plurality of first signal strips disposed selectively on the first surface;
a first power distribution plane provided on the first surface so as to occupy a residual area of the first signal strips, disposing spaces along both sides of the first signal strips such that the first signal strips are electrically isolated from the first power distribution planes;
a plurality of lands disposed on the second surface;
a plurality of via metals penetrating the insulating board so as to electrically connect the lands to the corresponding first signal strips respectively; and
a second power distribution plane provided on the second surface so as to occupy a residual area of the lands, disposing spaces along the lands such that the lands are electrically isolated from the second distribution plane.

2. The wiring board of claim 1, further comprising a plurality of second signal strips disposed on the second surface, connecting the lands to the corresponding via metals respectively, disposing spaces along both sides of the second signal strips such that the second signal strips are electrically isolated from the second power distribution plane.

3. The wiring board of claim 1, wherein a plurality of the first power distribution planes are arranged in mirror symmetry about the center line of the first surface.

4. The wiring board of claim 1, wherein each of the spacings between the first power distribution plane and the first signal strips is 30 µm to 120 µm.

5. The wiring board of claim 1, wherein the first and second power distribution planes have different electric potentials.

6. The wiring board of claim 1, wherein the first power distribution plane delivers a high power supply voltage and the second power distribution plane delivers a low power supply voltage.

7. The wiring board of claim 1, wherein the first signal strips and the lands are mutually arranged in a topology such that the positions of the lands do not face to the route of the first signal strips, being isolated by the wiring board.

8. The wiring board of claim 7, wherein the first signal strips have bends to avoid facing to the positions of the lands.

9. The wiring board of claim 1, wherein each of the first signal strips has a wiring pad portion protruded from a side defining a part of the contour of an area occupied by the first power distribution plane at an end of the corresponding first signal strip, opposing to the other end connected to the corresponding via metal.

10. The wiring board of claim 9, wherein the first power distribution plane has a power pad portion protruded in the same direction with the wiring pad portion at the side of the first power distribution plane.

11. A packaging assembly comprising:
an insulating board defined by a first surface and a second surface opposing to the first surface;
a plurality of first signal strips disposed selectively on the first surface;
a first power distribution plane provided on the first surface so as to occupy a residual area of the first signal strips, disposing spaces along both sides of the first signal strips such that the first signal strips are electrically isolated from the first power distribution planes;
a plurality of lands disposed on the second surface;
a plurality of via metals penetrating the insulating board so as to electrically connect the lands to the corresponding first signal strips respectively;
a second power distribution plane provided on the second surface so as to occupy a residual area of the lands, disposing spaces along the lands such that the lands are electrically isolated from the second distribution plane; and
a semiconductor chip disposed on the first surface connected to a plurality of the pad potion formed at the end of the first signal strips and the first power distribution plane.

12. The packaging assembly of claim 11, further comprising a plurality of second signal strips disposed on the second surface, connecting the lands to the corresponding via metals respectively, disposing spaces along both sides of the second signal strips such that the second signal strips are electrically isolated from the second power distribution plane.

13. The packaging assembly of claim 11, wherein a plurality of the first power distribution planes are arranged in mirror symmetry about the center line of the first surface.

14. The packaging assembly of claim 11, wherein each of the spacings between the first power distribution plane and the first signal strips is 30 $\mu$m to 120 $\mu$m.

15. The packaging assembly of claim 11, wherein the first and second power distribution planes have different electric potentials.

16. The packaging assembly of claim 11, wherein the first power distribution plane delivers a high power supply voltage and the second power distribution plane delivers a low power supply voltage.

17. The packaging assembly of claim 11, wherein the first signal strips and the lands are mutually arranged in a topology such that the positions of the lands do not face to the route of the first signal strips, being isolated by the wiring board.

18. The packaging assembly of claim 11, wherein the first signal strips have bends to avoid facing to the positions of the lands.

19. The packaging assembly of claim 11, wherein the semiconductor chip is disposed between two pieces of the first power distribution planes disposed separately.

20. The packaging assembly of claim 11, wherein the pad portion includes a wiring pad portion protruded from a side defining a part of the contour of an area occupied by the first power distribution plane at an end of the corresponding first signal strip, opposing to the other end connected to the corresponding via metal, and a power pad portion protruded in the same direction with the wiring pad portion at the side of the first power distribution plane.

21. The packaging assembly of claim 20, wherein the semiconductor chip is mounted face down on the first surface.

* * * * *